(12) United States Patent
Arase et al.

(10) Patent No.: US 9,018,042 B2
(45) Date of Patent: Apr. 28, 2015

(54) METHOD FOR FABRICATING A CHIP HAVING A WATER-REPELLENT OBVERSE SURFACE AND A HYDROPHILIC REVERSE SURFACE

(71) Applicant: Panasonic Intellectual Property Management Co., Ltd., Osaka (JP)

(72) Inventors: Hidekazu Arase, Hyogo (JP); Tomoyuki Komori, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/090,198

(22) Filed: Nov. 26, 2013

(65) Prior Publication Data

US 2014/0080261 A1    Mar. 20, 2014

Related U.S. Application Data

(63) Continuation of application No. PCT/JP2013/001701, filed on Mar. 14, 2013.

(30) Foreign Application Priority Data

Mar. 28, 2012 (JP) .................. 2012-073191

(51) Int. Cl.
*H01L 23/00* (2006.01)
*H01L 23/31* (2006.01)
*H01L 21/56* (2006.01)
*H01L 21/683* (2006.01)

(52) U.S. Cl.
CPC ............ *H01L 24/83* (2013.01); *H01L 23/3114* (2013.01); *H01L 21/56* (2013.01); *H01L 21/6836* (2013.01); *H01L 24/97* (2013.01); H01L 23/3107 (2013.01); H01L 23/3171 (2013.01); H01L 2221/68327 (2013.01); H01L 2221/68354 (2013.01); H01L 2224/95001 (2013.01); H01L 2224/95085 (2013.01); H01L2224/951 (2013.01); H01L 2224/95143 (2013.01)

(58) Field of Classification Search
None
See application file for complete search history.

(56) References Cited

U.S. PATENT DOCUMENTS

| | | | |
|---|---|---|---|
| 5,324,566 A | 6/1994 | Ogawa et al. | |
| 5,391,913 A * | 2/1995 | Mino et al. | 257/632 |
| 5,437,894 A | 8/1995 | Ogawa et al. | |
| 5,980,992 A * | 11/1999 | Kistner et al. | 427/384 |

(Continued)

FOREIGN PATENT DOCUMENTS

| | | |
|---|---|---|
| JP | 60-229932 | 11/1985 |
| JP | 2000-103007 | 4/2000 |
| WO | 2011/081095 | 7/2011 |

OTHER PUBLICATIONS

International Search Report issued Apr. 9, 2013 in International (PCT) Application No. PCT/JP2013/001701.

(Continued)

*Primary Examiner* — Charles Garber
*Assistant Examiner* — Stanetta Isaac
(74) *Attorney, Agent, or Firm* — Wenderoth, Lind & Ponack, L.L.P.

(57) ABSTRACT

In order to provide a novel method for producing a chip having a water-repellent obverse surface and a hydrophilic reverse surface, the characteristic of the present disclosure lies in that the obverse surface of the chip having a hydroxyl group is brought into contact with an organic solvent in which $R_1$—$Si(OR_2)_3$ or $R_1$—$SiY_3$ is dissolved in a second hydrophobic solvent, while the reverse surface of the chip is protected by the water film, so as to form a water-repellent film on the obverse surface of the chip.

10 Claims, 16 Drawing Sheets

(56) References Cited

U.S. PATENT DOCUMENTS

| | | |
|---|---|---|
| 7,730,610 B2 | 6/2010 | Nakagawa et al. |
| 2006/0115623 A1* | 6/2006 | Aizenberg et al. ............ 428/141 |
| 2009/0265929 A1 | 10/2009 | Nakagawa et al. |
| 2012/0291950 A1 | 11/2012 | Sugiyama et al. |

OTHER PUBLICATIONS

English translation of the International Preliminary Report on Patentability issued Oct. 9, 2014 in International (PCT) Application No. PCT/JP2013/001701.

* cited by examiner

800

METHOD FOR FABRICATING A CHIP HAVING A WATER-REPELLENT OBVERSE SURFACE AND A HYDROPHILIC REVERSE SURFACE

CROSS-REFERENCE TO RELATED APPLICATIONS

This is a continuation application of International Application No. PCT/JP2013/001701, with an international filing date of Mar. 14, 2013, which claims priority of Japanese Patent Application No. 2012-73191 filed on Mar. 28, 2012, the contents of which is incorporated herein by reference.

BACKGROUND OF THE INVENTION (1) Field of the Invention

The technical field relates to a method for fabricating a chip having a water-repellent obverse surface and a hydrophilic reverse surface.

(2) Description of Related Art

U.S. Pat. No. 7,730,610 discloses a method for disposing small components 20 such as chips on a substrate 10. This method is referred to as "FSA method". In the FSA method, as shown in FIG. 15A, prepared is the substrate 10 including a plurality of hydrophilic regions 11 and a water-repellent range 12 which surrounds the plurality of the hydrophilic regions 11. Then, as shown in FIG. 15B, the components 20 to be disposed on the substrate are dispersed in a solvent 40 which is substantially insoluble in water, so as to prepare a component-dispersing liquid 50. Since the reverse surface of the component 20 is hydrophilic, the reverse surface of the component 20 is able to be in contact with one of the hydrophilic regions 11. On the contrary, the obverse surface is water-repellent. Not only the obverse surface but also surfaces other than the reverse surface of the component 20 are water-repellent.

Then, as shown in FIG. 15C, water is disposed on the plurality of the hydrophilic regions 11 with a first squeegee 61. Subsequently, the component-dispersing liquid 50 is applied with a second squeegee 62 to bring the component-dispersing liquid 50 into contact with the water 31 which has been disposed on the hydrophilic regions 11. In this procedure, each component 20 moves into the water 31 which has been disposed on the hydrophilic region 11. At this stage, the hydrophilic reverse surface faces the hydrophilic region 11. Subsequently, the water 31 and the solvent contained in the component-dispersing liquid 50 are removed so as to dispose the component 20 on the hydrophilic region 11. The reverse surface of the disposed component 20 is in contact with the hydrophilic region 11. U.S. Pat. No. 7,730,610 is incorporated herein by reference.

SUMMARY

One non-limiting and exemplary embodiment provides a novel method for producing a chip having a water-repellent obverse surface and a hydrophilic reverse surface.

In one general aspect, the techniques disclosed here feature: a method for fabricating a chip having a water-repellent obverse surface and a hydrophilic reverse surface, the method including:

(a) preparing a first substrate comprising the chip on the reverse surface thereof through a wax film;

wherein the chip comprises an obverse surface and a reverse surface;

the obverse surface of the chip is in contact with the wax film;

the reverse surface of the chip is hydrophilic;

(b) bringing the reverse surface of the chip into contact with a second substrate having a water film on the obverse surface thereof to obtain a laminate composed of the first substrate and the second substrate;

wherein the reverse surface of the chip is brought into contact with the water film;

(c) immersing the laminate in a first hydrophobic solvent to dissolve the wax film in the first hydrophobic solvent;

(d) removing the first substrate to obtain the second substrate where the chip is attached on the obverse surface thereof;

wherein the reverse surface of the chip is in contact with the water film; and the obverse surface of the chip is exposed;

(e) bringing the obverse surface of the chip having a hydroxyl group into contact with an organic solvent in which $R_1$—$Si(OR_2)_3$ or $R_1$—$SiY_3$ is dissolved in a second hydrophobic solvent, while the reverse surface of the chip is protected by the water film, so as to form a water-repellent film on the obverse surface of the chip; wherein $R_1$ represents a hydrocarbon group or a fluorinated hydrocarbon group;

$R_2$ represents an alkoxy group; and

Y represents halogen; and (f) removing the second substrate to obtain the chip having the water-repellent obverse surface and the hydrophilic reverse surface.

The present disclosure provides a novel method for producing a chip having a water-repellent obverse surface and a hydrophilic reverse surface.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same

BRIEF DESCRIPTION OF DRAWINGS

The present disclosure will become readily understood from the following description of preferred embodiments thereof made with reference to the accompanying drawings, in which like parts are designated by like reference numeral and in which.

DETAILED DESCRIPTION

Figure 1:
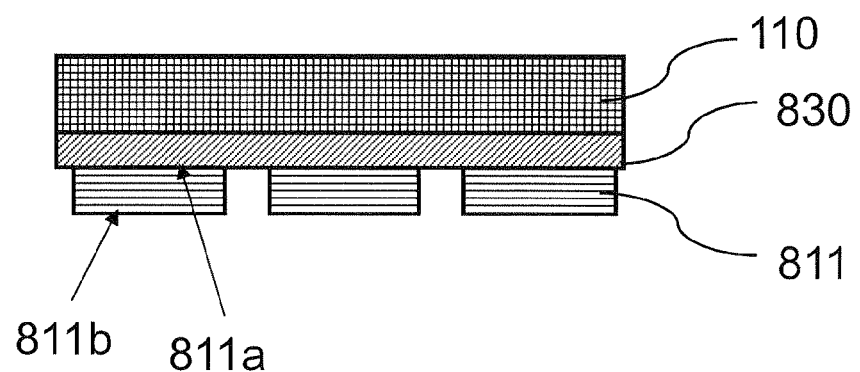
FIG. 1 shows the step (a) included in the chip fabrication method according to the embodiment.

According to a first aspect, a method for fabricating a chip having a water-repellent obverse surface and a hydrophilic reverse surface, the method includes:

(a) preparing a first substrate comprising the chip on the reverse surface thereof through a wax film;

wherein the chip comprises an obverse surface and a reverse surface;

the obverse surface of the chip is in contact with the wax film 830;

the reverse surface of the chip is hydrophilic;

(b) bringing the reverse surface of the chip into contact with a second substrate having a water film on the obverse surface thereof to obtain a laminate composed of the first substrate and the second substrate;

wherein the reverse surface of the chip is brought into contact with the water film;

(c) immersing the laminate in a first hydrophobic solvent to dissolve the wax film in the first hydrophobic solvent;

(d) removing the first substrate to obtain the second substrate where the chip is attached on the obverse surface thereof;

wherein the reverse surface of the chip is in contact with the water film; and the obverse surface of the chip is exposed;

(e) bringing the obverse surface of the chip having a hydroxyl group into contact with an organic solvent in which $R_1$—$Si(OR_2)_3$ or $R_1$—$SiY_3$ is dissolved in a second hydrophobic solvent, while the reverse surface of the chip is protected by the water film, so as to form a water-repellent film on the obverse surface of the chip; wherein $R_1$ represents a hydrocarbon group or a fluorinated hydrocarbon group;

$R_2$ represents an alkoxy group; and

Y represents halogen; and (f) removing the second substrate to obtain the chip having the water-repellent obverse surface and the hydrophilic reverse surface.

Further, as a method of a second aspect, in the first aspect, the wax film is adhesive.

Further, as a method of a third aspect, in the first aspect, the first hydrophobic solvent is butyl acetate, ethyl acetate, chloroform, toluene, or the mixture thereof.

Further, as a method of a fourth aspect, in the first aspect, in the step (e), the second substrate where the chip is attached on the obverse surface thereof is immersed in the organic solvent.

Further, as a method of a fifth aspect, in the first aspect, the second hydrophobic solvent is hydrocarbon having a carbon number of not less than 6, butyl acetate, ethyl acetate, chloroform, or the mixture thereof.

According to a sixth aspect, a method for fabricating a chip having a water-repellent obverse surface and a hydrophilic reverse surface, the method includes:

(a) preparing a first substrate comprising the chip on the reverse surface thereof through a wax film;

wherein the chip comprises an obverse surface and a reverse surface;

the obverse surface of the chip is in contact with the wax film;

the reverse surface of the chip is hydrophilic;

(b) bringing the reverse surface of the chip into contact with a second substrate having a water film on the obverse surface thereof to obtain a laminate composed of the first substrate and the second substrate; wherein the reverse surface of the chip is brought into contact with the water film;

(c) immersing the laminate in a first hydrophobic solvent to dissolve the wax film in the first hydrophobic solvent;

(d) removing the first substrate to obtain the second substrate where the chip is attached on the obverse surface thereof;

wherein the reverse surface of the chip is in contact with the water film; and the obverse surface of the chip is exposed;

(e) bringing the obverse surface of the chip having gold into contact with an organic solvent in which Ri—SH is dissolved in a second hydrophobic solvent, while the reverse surface of the chip is protected by the water film, so as to form a water-repellent film on the obverse surface of the chip;

wherein $R_1$ represents a hydrocarbon group or a fluorinated hydrocarbon group; and (f) removing the second substrate to obtain the chip having the water-repellent obverse surface and the hydrophilic reverse surface.

Further, as a method of a seventh aspect, in the sixth aspect, the wax film is adhesive.

Further, as a method of an eighth aspect, in the sixth aspect, the first hydrophobic solvent is butyl acetate, ethyl acetate, chloroform, toluene, or the mixture thereof.

Further, as a method of a ninth aspect, in the sixth aspect, in the step (e), the second substrate where the chip is attached on the obverse surface thereof is immersed in the organic solvent.

Further, as a method of a tenth aspect, in the sixth aspect, the second hydrophobic solvent is hydrocarbon having a carbon number of not less than 6, butyl acetate, ethyl acetate, chloroform, or the mixture thereof.

The embodiment of the present disclosure is described with reference to the drawings.

The following steps (a) to (f) are performed in this order.

(Step (a))

First, as shown in FIG. 1, a first substrate 110 is prepared.

The first substrate 110 comprises a wax film 830 on the reverse surface thereof. An example of the material of the wax film 830 is terpene phenol resin. Wax is applied on the reverse surface of the first substrate 110 to form the wax film 830. An example of the method for applying the wax is a spin-coater method.

A chip 811 is provided on the reverse surface 811b of the first substrate 110 through the wax film 830. The chip 811 includes an obverse surface 811a and a reverse surface 811b. The obverse surface 811a is in contact with the wax film 830. On the other hand, the reverse surface 811b is exposed.

The term "obverse surface" means a top surface. On the other hand, the term "reverse surface" means a bottom surface.

The wax film 830 is adhesive in order to prevent the chip 811 from falling down from the reverse surface of the first substrate 110.

An example of the chip 811 is a semiconductor element or a solar cell element. It is desirable that electrodes are exposed on the reverse surface 811b of the chip 811. When the chip 811 is disposed by the FSA method to the substrate 10, the electrodes exposed on the reverse surface 811b are brought into contact with electrodes provided on the surface of the substrate 10.

The reverse surface 811b of the chip 811 is hydrophilic. An example of the method for causing the reverse surface 811b to be hydrophilic is described in the following items (a) to (c):

(a) The reverse surface of the first substrate 110 where the chip 811 is attached is irradiated with plasma.

(b) Either a silicon oxide layer or a silicon nitride layer is formed on the reverse surface 811b of the chip 811.

(c) After a gold layer or a copper layer is formed on the reverse surface 811b of the chip 811, an organic compound shown by the following chemical formula: X—R—SH is supplied to the reverse surface 811b of the chip 811. Here, X represents —COOH, —OH, —$SO_3$, or —$SO_4$.

(Step (b))

Figure 2:
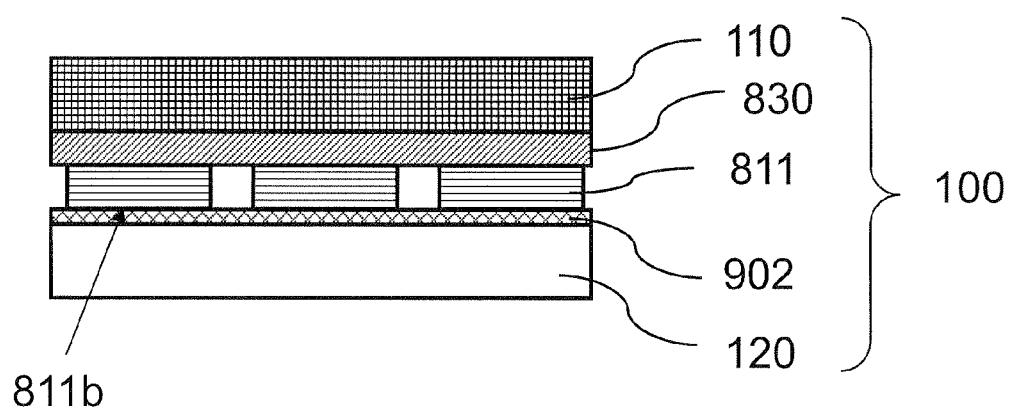
FIG. 2 shows the step (b) included in the chip fabrication method according to the embodiment.

Then, as shown in FIG. 2, the reverse surface 811b of the chip 811 is brought into contact with a second substrate having a water film 902 on the obverse surface thereof. In this way, a laminate 100 composed of the first substrate 110 and the second substrate 120 is obtained. As shown in FIG. 2, the reverse surface 811b of the chip 811 is in contact with the water film 902.

(Step (c))

Figure 3:
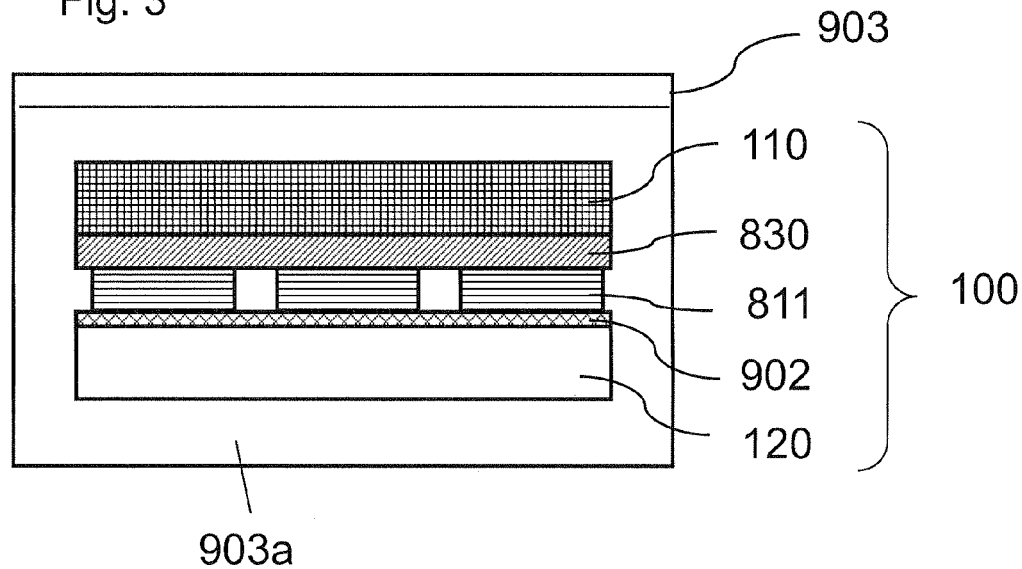
FIG. 3 shows the step (c) included in the chip fabrication method according to the embodiment.

In the step (c), as shown FIG. 3, the laminate 100 is immersed in a container 903 containing a first hydrophobic solvent 903a. The first hydrophobic solvent 903a dissolves the wax film 830. An example of the first hydrophobic solvent 903a is butyl acetate, ethyl acetate, chloroform, toluene, or these mixtures. Butyl acetate was used in the example, which is described later.

Since the water film 902 is insoluble in the first hydrophobic solvent 903a, the reverse surface 811b of the chip 811 remains hydrophilic. In other words, the hydrophilic reverse surface 811b of the chip 811 is protected from the first hydrophobic solvent 903a with the water film 902.

(Step (d))

Figure 4:
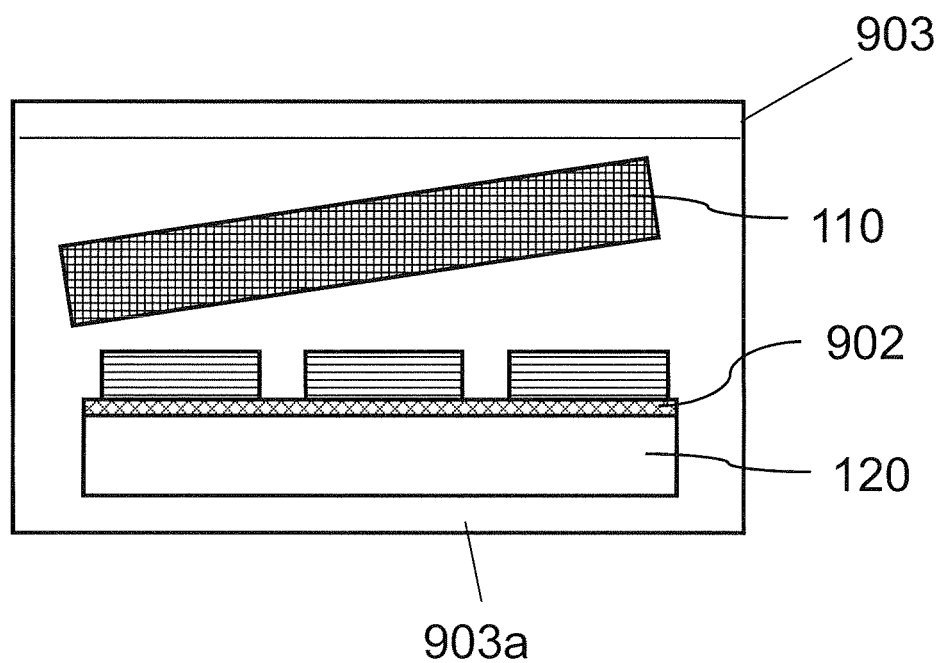
FIG. 4 shows the step (d) included in the chip fabrication method according to the embodiment.

Since the wax film 830 is dissolved in the step (c), the first substrate 110 is removed easily as shown in FIG. 4. Desirably, the first substrate 110 is separated from the second substrate 120 in the first hydrophobic solvent 903a. In this way, the second substrate 120 where the chip 811 is attached on the obverse surface is obtained. The reverse surface 811b of the chip 811 is in contact with the water film 902. On the other hand, the obverse surface of the chip 811 is exposed.

(Step (e))

In the step (e), the obverse surface 811a of the chip 811 is caused to be water-repellent. An example of the method for causing the obverse surface 811a to be water-repellent is described below.

Figure 5:
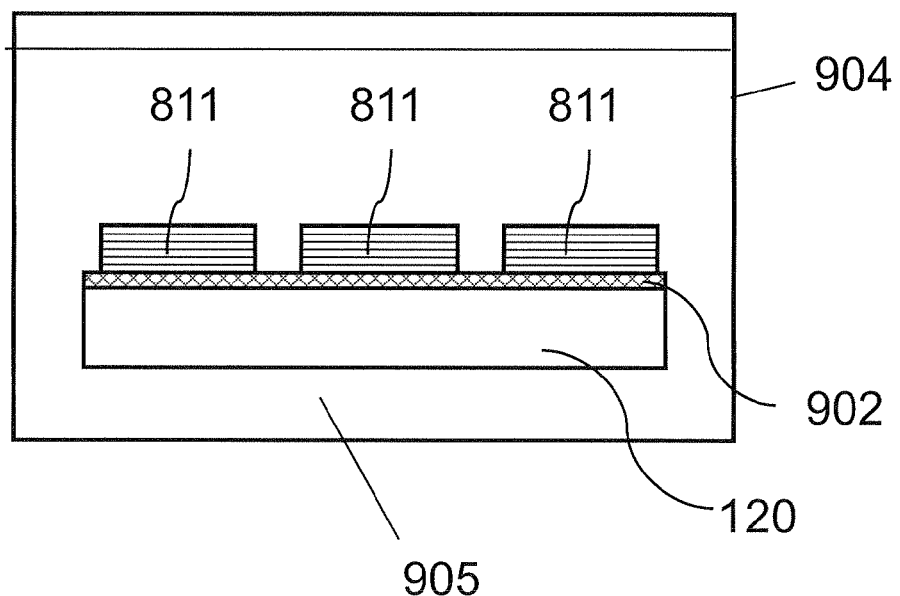
FIG. 5 shows the step (e) included in the chip fabrication method according to the embodiment.

As shown in FIG. 5, the second substrate 120 where the chip 811 is attached on the obverse surface thereof is immersed in a container 904 containing an organic solution 905. The organic solution 905 contains $R_1$—$Si(OR_2)_3$, $R_1$—$SiY_3$, or Ri—SH. Here, $R_1$ represents a hydrocarbon group or a fluorinated hydrocarbon group. $R_2$ represents an alkoxy group. Y represents a halogen. A desirable halogen is chlorine.

The obverse surface 811a of the chip 811 reacts with $R_1$—$Si(OR_2)_3$, $R_1$—$SiY_3$, or Ri—SH to form a water-repellent film on the obverse surface of the chip 811.

The solvent of the organic solution 905 is hydrophobic. In order to distinguish from the first hydrophobic solvent 903a, the hydrophobic solvent used in the step (e) is referred to as "second hydrophobic solvent 905a". An example of the second hydrophobic solvent 905a is hydrocarbon having a carbon number of not less than 6, butyl acetate, ethyl acetate, chloroform or the mixture thereof. Chloroform/hexadecane mixture was used in the example, which is described later.

Similarly to the description in the step (c), since the water film 902 is insoluble in the second hydrophobic solvent 905a, the reverse surface 811b of the chip 811 remains hydrophilic. In other words, the hydrophilic reverse surface 811b of the chip 811 is protected from the second hydrophobic solvent 905a by the water film 902. For this reason, the water-repellent film is not formed on the hydrophilic reverse surface 811b of the chip 811. On the other hand, as described above, the water-repellent film is formed on the obverse surface 811a of the chip 811.

$R_1$—$Si(OR_2)_3$ or $R_1$—$SiY_3$ contained in the organic solution 905 reacts with a hydroxyl group existed on the obverse surface 811a of the chip 811 to form the water-repellent film. Such a hydroxyl group is formed by exposing the chip 811 to natural oxidation. Accordingly, it is desirable that the chip 811 is exposed to natural oxidation before the chip 811 is immersed in the organic solution 905.

Ri—SH contained in the organic solution 905 reacts with a gold film formed on the obverse surface 811a of the chip 811 to form the water-repellent film. Accordingly, it is desirable that the gold film is formed on the obverse surface of the chip 811 before the chip 811 is immersed in the organic solution 905.

(Step (f))

After the step (e), the second substrate 120 is removed. Since the obverse surface of the second substrate 120 has no adhesivity, the second substrate 20 is removed easily. In this way, the chip 811 having a water-repellent obverse surface 811a and a hydrophilic reverse surface 811b is provided.

EXAMPLE

The following example describes the present disclosure in more detail.

A plurality of plate-like GaAs elements were prepared as the chips 811. A method for fabricating the plurality of the plate-like GaAs elements is described with reference to the drawings.

Figure 6:
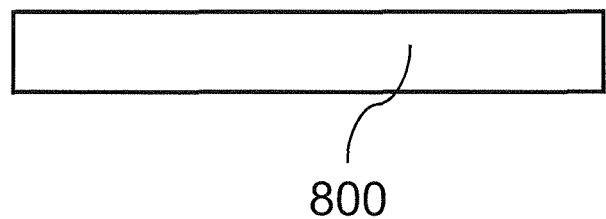
FIG. 6 shows one step included in the chip fabrication method according to the example.
Figure 7:
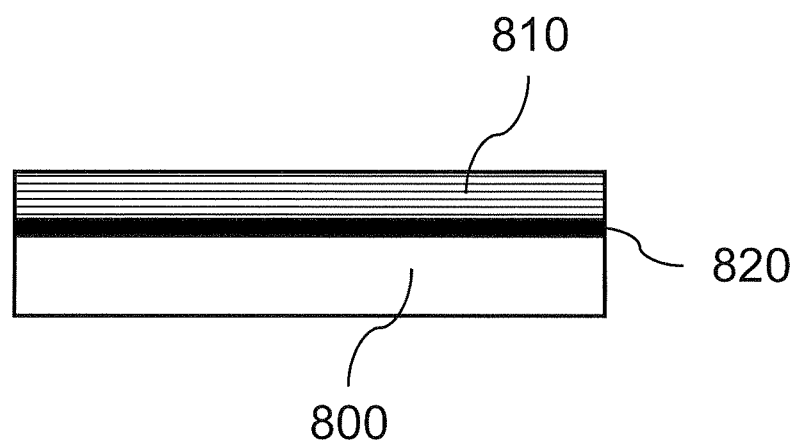
FIG. 7 shows one step included in the chip fabrication method according to the example, subsequently to FIG. 6.

First, as shown in FIG. 6, a GaAs substrate was prepared as a support substrate 800. The thickness of the support substrate 800 was 450 micrometers. Then, as shown in FIG. 7, an AlAs layer 820 having a thickness of 100 nanometers was formed on the obverse surface of the support substrate 800. Furthermore, the GaAs layer 810 having a thickness of 5 micrometers was formed on the obverse surface of the AlAs layer 820.

Figure 8:
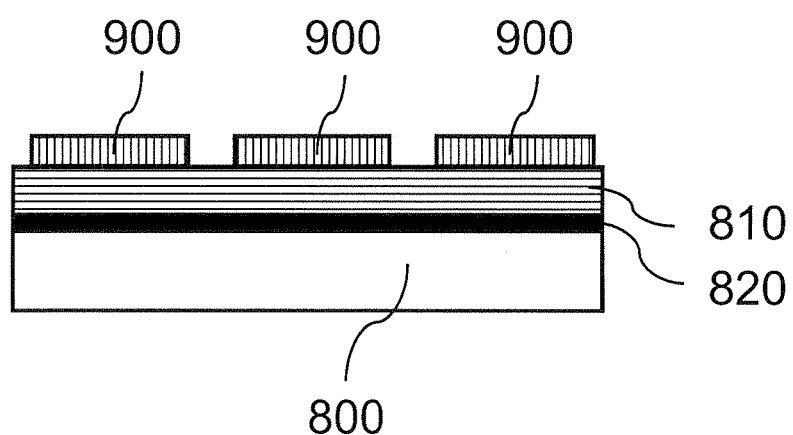
FIG. 8 shows one step included in the chip fabrication method according to the example, subsequently to FIG. 7.
Figure 9:
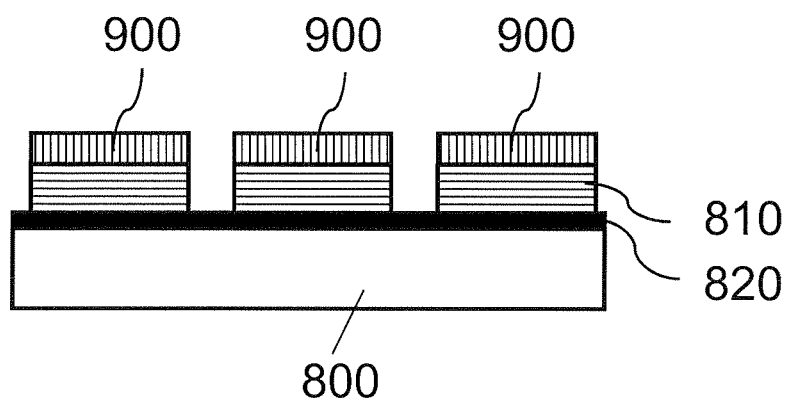
FIG. 9 shows one step included in the chip fabrication method according to the example, subsequently to FIG. 8.
Figure 10:
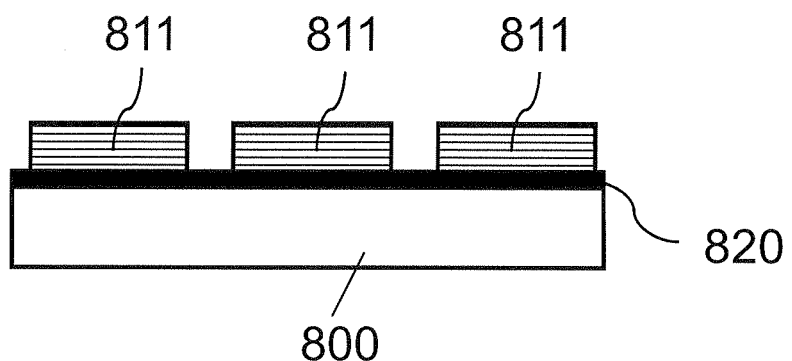
FIG. 10 shows one step included in the chip fabrication method according to the example, subsequently to FIG. 9.

Subsequently, as shown in FIG. 8, a mask layer 900 was formed on the obverse surface of the GaAs layer 810. As shown in FIG. 9, a portion not covered by the mask layer 900 was removed by wet-etching. Subsequently, the mask layer 900 was removed. In this way, as shown in FIG. 10, the plurality of the chips 811 each formed of a GaAs element was formed on the support substrate 800.

Each chip 811 had a length of 150 micrometers, a width of 150 micrometers, and a thickness of 5.1 micrometers.

Figure 11:
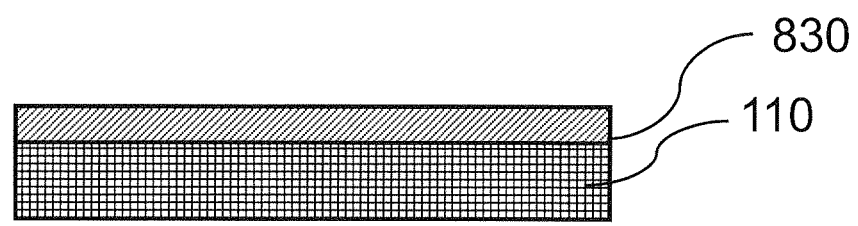
FIG. 11 shows one step included in the chip fabrication method according to the example.

Meanwhile, as shown in FIG. 11, a glass substrate having a thickness of 700 micrometers was prepared as the first substrate 110. Terpene phenol resin wax was applied on the obverse surface of the first substrate 110 by a spin coat method to form the wax film 830. The terpene phenol resin wax was purchased from NIKKA SEIKO CO., LTD. as a trade name of "SPACELIQUID". The wax film 830 had a thickness of 1.5 micrometers.

Figure 12:
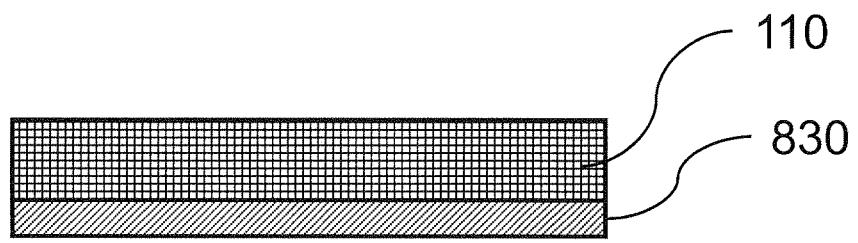
FIG. 12 shows one step included in the chip fabrication method according to the example, subsequently to FIG. 11.

Subsequently, as shown in FIG. 12, the first substrate 110 was inverted.

Figure 13:
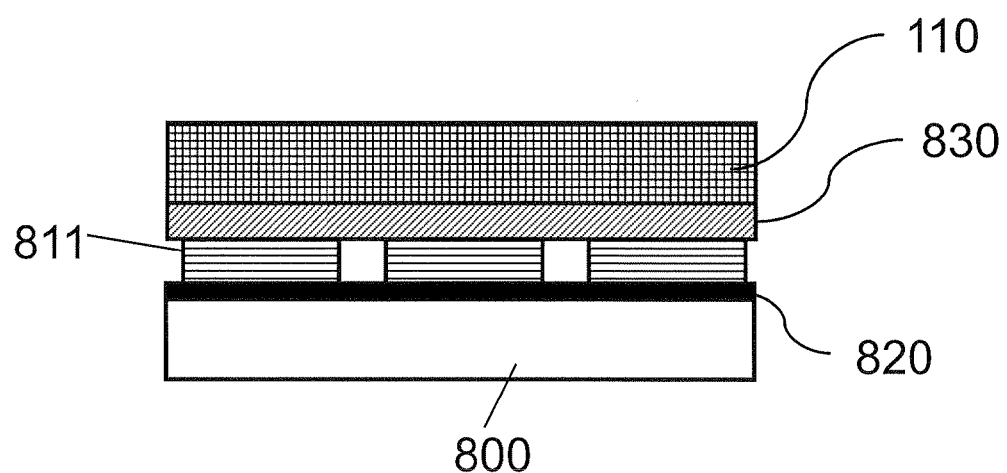
FIG. 13 shows one step included in the chip fabrication method according to the example.
Figure 14:
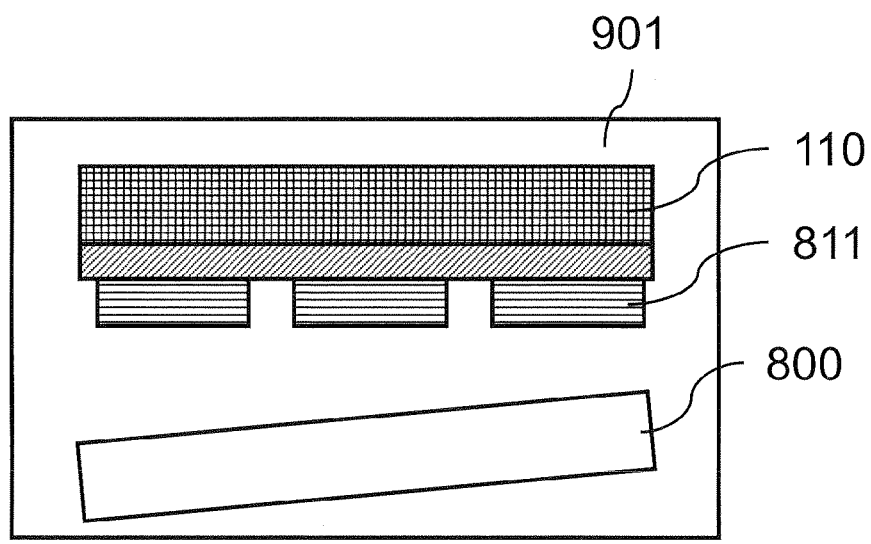
FIG. 14 shows one step included in the chip fabrication method according to the example, subsequently to FIG. 13.
Figure 15A:
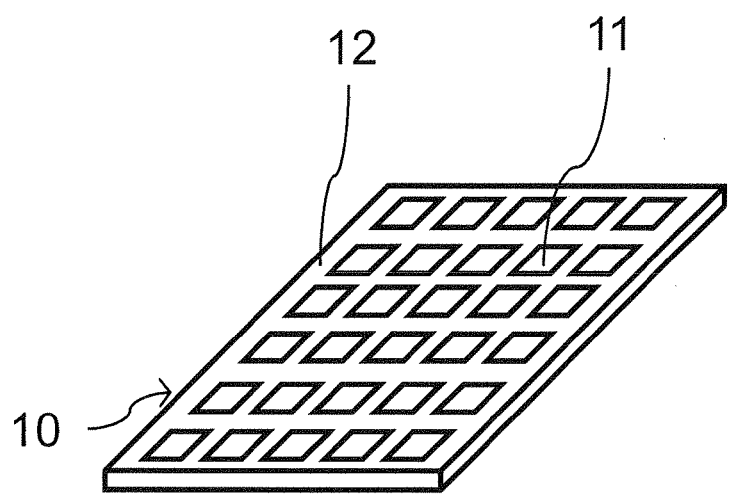
FIG. 15A shows one step of the FSA method, which is disclosed in U.S. Pat. No. 7,730,610.
Figure 15B:
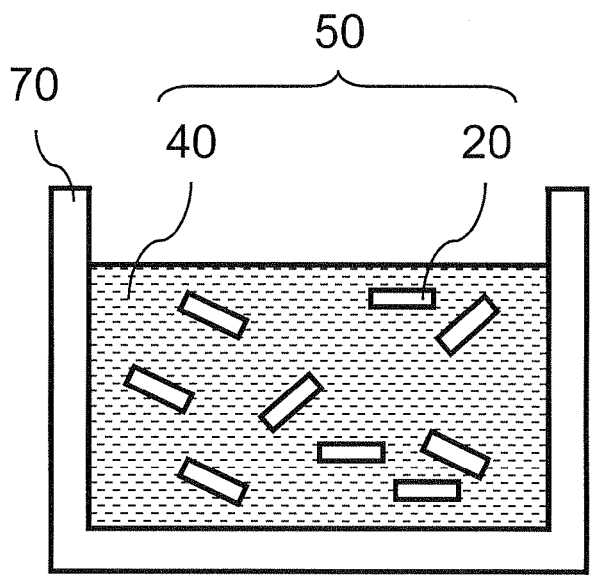
FIG. 15B shows one step of the FSA method, which is disclosed in U.S. Pat. No. 7,730,610.
Figure 15C:
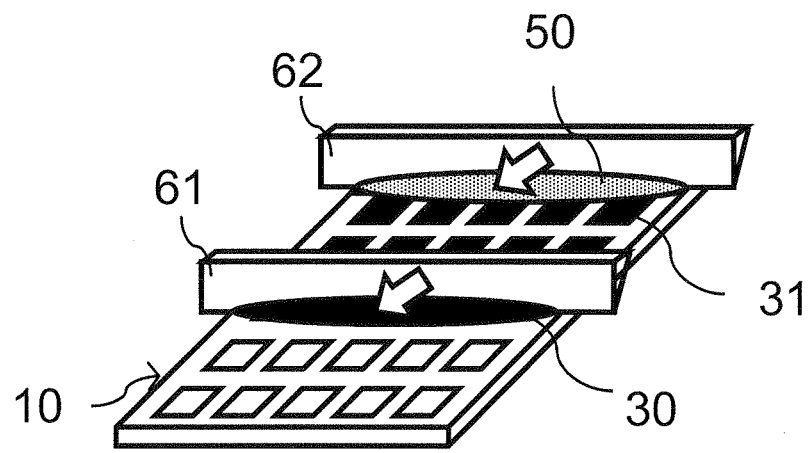
FIG. 15C shows one step of the FSA method, which is disclosed in U.S. Pat. No. 7,730,610.
Figure 15D:
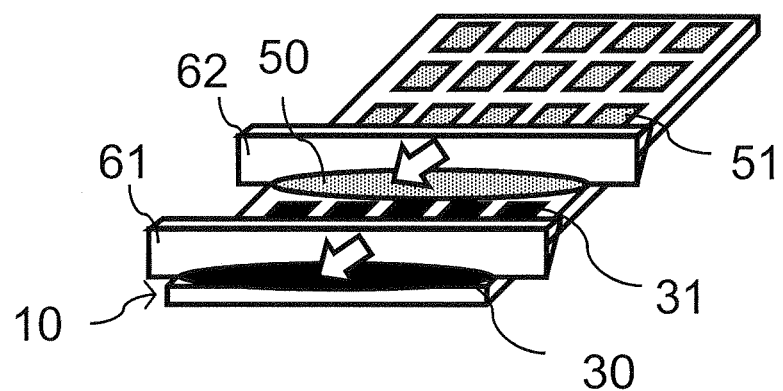
FIG. 15D shows one step of the FSA method, which is disclosed in U.S. Pat. No. 7,730,610.

As shown in FIG. 13, the first substrate 110 was stacked on the support substrate 800 in such a manner that the wax film 830 is brought into contact with the obverse surface 811a of the chip 811. Subsequently, as shown in FIG. 14, the support substrate 800 and the first substrate 110 were immersed in a hydrochloric acid aqueous solution 901 having a concentration of 1 M to dissolve the AlAs layer 820. In this way, the support substrate 800 was removed to obtain the first substrate 110 comprising the chips 811 on the reverse surface thereof through the adhesive wax film 830, as shown in FIG. 1.

An oxygen-plasma treatment was performed from the reverse surface of the first substrate 110 to cause the reverse surfaces 811b of the chips 811 to be hydrophilic.

Meanwhile, a silicon substrate was prepared as the second substrate 120. This second substrate 120 had a thickness of 525 micrometers. The obverse surface of the second substrate 120 was exposed to plasma treatment under an oxygen atmosphere. In this way, the obverse surface of the second substrate 120 was caused to be hydrophilic. Then, the second substrate 120 was immersed in water to from the water film 902 on the obverse surface of the second substrate 120.

Then, as shown in FIG. 2, the reverse surface of the first substrate 110 was attached to the obverse surface of the second substrate 120 in such a manner that reverse surface 811b of the chip 811 was brought into contact with the water film 902 so as to obtain the laminate 100.

As shown in FIG. 3, the laminate 100 was immersed in butyl acetate under a temperature of 40 degrees Celsius. The wax film 830 was dissolved by the butyl acetate. Subsequently, as shown in FIG. 4, the first substrate 110 was removed easily in the butyl acetate. In this way, obtained was the second substrate 120 having the plurality of the chips 811 on the obverse surface thereof through the water film 902.

Then, as shown in FIG. 5, this second substrate 120 was immersed for 60 minutes in a chloroform/hexadecane mixture (volume ratio=1:4) containing $CH_3CH_2CH_2SiCl_3$ (hereinafter, referred to as "PTS") having a concentration of 0.1% by volume to be shown in FIG. 5. Subsequently, the plurality of the chips 811 disposed on the obverse surface of this second substrate 120 was washed in pure chloroform and the chloroform was removed. In this way, the obverse surfaces 811a of the plate-like chips 811 were coated by the water-repellent film consisting of PTS. During this time, the hydrophilic reverse surfaces 811b of the chips 811 were protected by the water film 902. Therefore, the water-repellent film was not formed on the reverse surfaces 811b of the chips 811. In other words, the reverse surfaces 811b of the chips 811 were not coated by the water-repellent film.

In this way, the chips 811 each having a water-repellent obverse surface 811a and a hydrophilic reverse surface 811b were obtained. In more detail, the whole of the obverse surface of the obverse surface 811a was water-repellent, whereas the whole of the reverse surface 811b was hydrophilic.

The chip obtained according to the present method may be used in the FSA method.

The invention claimed is:

1. A method for fabricating a chip having a water-repellent obverse surface and a hydrophilic reverse surface, the method comprising:
   (a) preparing a first substrate comprising the chip on the reverse surface thereof through a wax film;
   wherein the chip comprises an obverse surface and a reverse surface;
   the obverse surface of the chip is in contact with the wax film 830;
   the reverse surface of the chip is hydrophilic;
   (b) bringing the reverse surface of the chip into contact with a second substrate having a water film on the obverse surface thereof to obtain a laminate composed of the first substrate and the second substrate;
   wherein the reverse surface of the chip is brought into contact with the water film;
   (c) immersing the laminate in a first hydrophobic solvent to dissolve the wax film in the first hydrophobic solvent;
   (d) removing the first substrate to obtain the second substrate where the chip is attached on the obverse surface thereof;
   wherein the reverse surface of the chip is in contact with the water film; and
   the obverse surface of the chip is exposed;
   (e) bringing the obverse surface of the chip having a hydroxyl group into contact with an organic solvent in which $R_1$—$Si(OR_2)_3$ or $R_1$—$SiY_3$ is dissolved in a second hydrophobic solvent, while the reverse surface of the chip is protected by the water film, so as to form a water-repellent film on the obverse surface of the chip; wherein
   $R_1$ represents a hydrocarbon group or a fluorinated hydrocarbon group;
   $R_2$ represents an alkoxy group; and
   Y represents halogen; and
   (f) removing the second substrate to obtain the chip having the water-repellent obverse surface and the hydrophilic reverse surface.

2. The method according to claim 1, wherein the wax film is adhesive.

3. The method according to claim 1, wherein the first hydrophobic solvent is butyl acetate, ethyl acetate, chloroform, toluene, or the mixture thereof.

4. The method according to claim 1, wherein in the step (e), the second substrate where the chip is attached on the obverse surface thereof is immersed in the organic solvent.

5. The method according to claim 1, wherein the second hydrophobic solvent is hydrocarbon having a carbon number of not less than 6, butyl acetate, ethyl acetate, chloroform, or the mixture thereof.

6. A method for fabricating a chip having a water-repellent obverse surface and a hydrophilic reverse surface, the method comprising:
   (a) preparing a first substrate comprising the chip on the reverse surface thereof through a wax film;
   wherein the chip comprises an obverse surface and a reverse surface;
   the obverse surface of the chip is in contact with the wax film;
   the reverse surface of the chip is hydrophilic;
   (b) bringing the reverse surface of the chip into contact with a second substrate having a water film on the obverse surface thereof to obtain a laminate composed of the first substrate and the second substrate;
   wherein the reverse surface of the chip is brought into contact with the water film;

(c) immersing the laminate in a first hydrophobic solvent to dissolve the wax film in the first hydrophobic solvent;

(d) removing the first substrate to obtain the second substrate where the chip is attached on the obverse surface thereof;

wherein the reverse surface of the chip is in contact with the water film; and the obverse surface of the chip is exposed;

(e) bringing the obverse surface of the chip having gold into contact with an organic solvent in which $R_i$—SH is dissolved in a second hydrophobic solvent, while the reverse surface of the chip is protected by the water film, so as to form a water-repellent film on the obverse surface of the chip;

wherein $R_1$ represents a hydrocarbon group or a fluorinated hydrocarbon group; and (f) removing the second substrate to obtain the chip having the water-repellent obverse surface and the hydrophilic reverse surface.

7. The method according to claim 6, wherein the wax film is adhesive.

8. The method according to claim 6, wherein the first hydrophobic solvent is butyl acetate, ethyl acetate, chloroform, toluene, or the mixture thereof.

9. The method according to claim 6, wherein in the step (e), the second substrate where the chip is attached on the obverse surface thereof is immersed in the organic solvent.

10. The method according to claim 6, wherein the second hydrophobic solvent is hydrocarbon having a carbon number of not less than 6, butyl acetate, ethyl acetate, chloroform, or the mixture thereof.

\* \* \* \* \*